United States Patent [19]

Lunner et al.

[11] Patent Number: 5,436,859
[45] Date of Patent: Jul. 25, 1995

[54] METHOD TO REDUCE THE POWER CONSUMPTION OF A DIGITAL FILTER BANK ANALYZER REDUCING THE NUMBER OF MULTIPLICATIONS

[76] Inventors: Thomas Lunner, Krigsbergs Rusthall, S-590 30 Borensberg; Johan Hellgren, Abylundsgatan 70, S-582 36 Linköping, both of Sweden

[21] Appl. No.: 81,263
[22] PCT Filed: Dec. 13, 1991
[86] PCT No.: PCT/SE91/00860
    § 371 Date: Mar. 17, 1994
    § 102(e) Date: Mar. 17, 1994
[87] PCT Pub. No.: WO92/11696
    PCT Pub. Date: Jul. 9, 1992

[30] Foreign Application Priority Data

Dec. 19, 1990 [SE] Sweden ............... 9004055

[51] Int. Cl.⁶ ............................................. G06F 15/31
[52] U.S. Cl. ............................ 364/724.16; 364/724.1
[58] Field of Search ..................... 364/724.16, 724.1

[56] References Cited

U.S. PATENT DOCUMENTS

| | | | |
|---|---|---|---|
| 4,542,475 | 9/1985 | Acampora | 364/724.16 |
| 4,615,026 | 9/1986 | Schiff | 364/724.16 |
| 4,766,562 | 8/1988 | Vary | 364/724.1 |
| 4,829,378 | 5/1989 | LeGall | 364/724.16 |
| 5,050,119 | 9/1991 | Lish | 364/724.16 |

OTHER PUBLICATIONS

R. E. Crochiere and L. R. Rabiner, "Multirate Digital Signal Processing", Prentice-Hall, 1983 Ch. 7, pp. 289-296, and 376-378 and 392-395.

*Primary Examiner*—David H. Malzahn
*Attorney, Agent, or Firm*—John Lezdey

[57] ABSTRACT

A digital filter bank analyzer for reducing power consumption by decreasing the number of multiplications carried out therein. There is particularly provided a filter bank analyzer for use in battery-operated applications. The digital filter bank analyzer includes a zero-filled expanded digital basic filter [$H_1(z)$] having a complementary output, and downstream, parallel part-filter banks [$H_{D1},H_{D2}$]. In the present context, a zero-filled filter pertains to a filter which may be used on an LP-filter that which is expanded with a number of zero-filter coefficients between each coefficient in the original filter. The part-filter bank [$H_{D1}$] connected to the normal output of the basic filter [$H_1(z)$] is intended to filter-out those filter-bank bands which are pass bands to the basic filter, so that only one of the filter-bank bands is found on each output signal from said one part-filter bank [$H_{D1}$]. The other part-filter bank [$H_{D2}$] connected to the complementary output of the basic filter [$H_1(z)$] is intended to filter-out those filter-bank bands which are pass bands to the complementary output of the basic filter, so that only one filter-bank band is found on each output signal from the second part-filter bank [$H_{D2}$].

10 Claims, 15 Drawing Sheets

METHOD TO REDUCE THE POWER CONSUMPTION OF A DIGITAL FILTER BANK ANALYZER REDUCING THE NUMBER OF MULTIPLICATIONS

The present invention relates to a digital filter bank intended for use, for instance, in battery-operated applications, in which power consumption is decreased by reducing the number of multiplications performed in the filter bank.

In digital signal processing, there is a need in many different contexts to minimize the power consumption in a given system. This may apply, for instance, to battery-operated applications. Digital filters are often more power consuming that corresponding analog filters. The reason why the power consumption of digital filtering processes is relatively high, is because a large number of operations are often carried out each second. Band filtering with the aid of filter banks is one filtering method that is often used. The filter bank can be used when a number of frequency bands are to be separated, or when it is desired to amplify different frequency bands to different degrees of amplification.

When bandpass filtering with the aid of a digital filter bank, a high degree number is often required on the filters included in the bank, in order for the filter bank to be sufficiently selected. Higher degree numbers imply many multiplications per sample and per second. In digital filtration processes, the power consumed is often proportional to the number of coefficients (multiplications) in the filter impulse response. Power consumption can therefore be reduced by reducing the number of multiplications. This is achieved in accordance with the invention with a digital filter bank which includes:

A zero-filled digital basic filter having a complementary output, wherein the zero-filled filter relates to a filter, which may be based on an LP-filter, which can be expanded with a number of zero-value filter coefficients between each coefficient in the original filter; and downstream mutually parallel part-filter banks; wherein the passband of the basic filter and the pass-band of the complementary output of said basic filter define the filter-bank band; wherein one of the part-filter banks connected to the normal output of the basic filter is intended to filter-out those filter-bank bands which are pass bands to the basic filter, so that only one of the filter-bank bands is present on each signal from said one part-filter bank; and wherein the other part-filter bank connected to the complementary output of the basic filter is intended to filter-out those filter-bank bands which are pass bands to the complementary output of the basic filter, so that only one filter-bank band is found on each output signal from said other part-filter bank.

The term filter-bank band as used here and in the following is intended to denote one of the frequency bands present in the output signals of the filter bank.

Preferred embodiments of the novel filter bank are set forth in the dependent Claims.

The invention will now be described in more detail with reference to the accompanying drawings, in which FIG. 1 illustrates a linear phase FIR-filter of uniform degree number, where the number of multiplications has been reduced to almost half;

Figure 1:
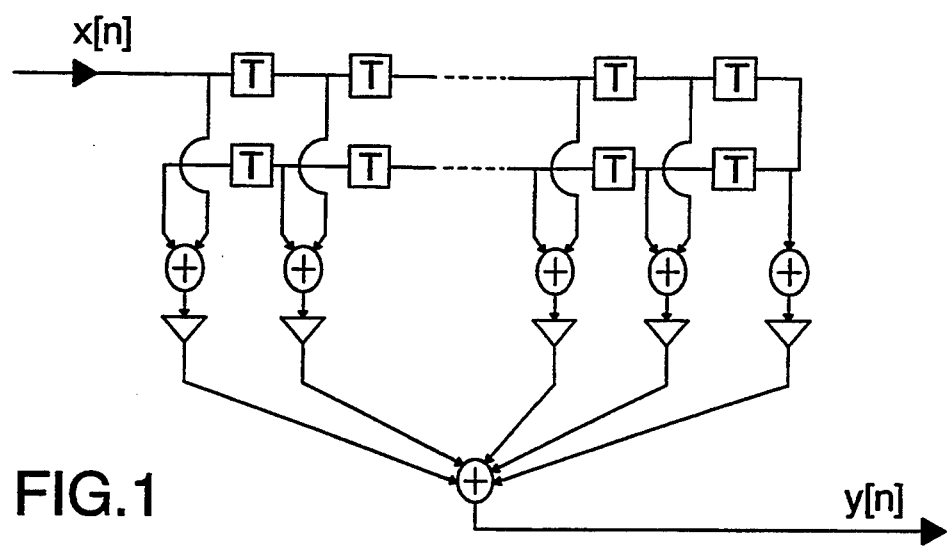

One type of filter that has good properties is a linear phase FIR-filter (Finite Impulse Response). The impulse response of this filter is symmetrical and is described by $h(k)=h(N-k)$, where $k=0, \ldots, N-1$, where N is the degree number of the filter. When realizing such a filter, it is therefore possible to half directly the number of multiplications with the aid of a suitable structure; see FIG. 1. The linear phase FIR-filter is described in more detail in "Multirate Digital Signal Processing" by R. E. Crochiere and L. R. Rabiner, Prentice-Hall, 1983. This publication also describes the configuration of a linear phase FIR-filter with the so-called Remez-algorithm.

Two filters, $H(z)$ and $H_c(z)$ are complementary when they fulfil the condition:

$$|H(z)+H_c(z)|=1 \text{ for all } |z|=1$$

Thus, when the filters have the same input signal and the output signals are added together, the result is the same as when the input signal has been delayed in correspondence with the group transit time of the filters.

The complementary output signal $H_c(z)$ can be obtained from a linear phase FIR-filter $H(z)$ having a uniform degree number N, from the relationship:

$$H_c(z)=z^{-N/2}-H(z)$$

Figure 2:
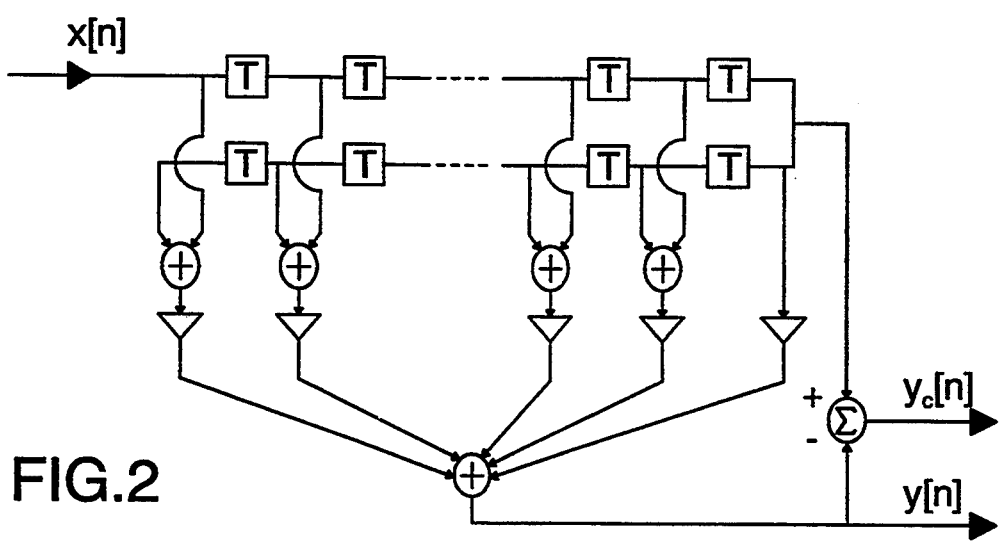
FIG. 2 illustrates a linear phase FIR-filter with a complementary output.

FIG. 2 shows that the complementary output $H_c(z)$ can be obtained in a very simple manner, when the filter $H(z)$ is a linear phase FIR-filter of uniform degree number, which is realized in the form of a transversal filter.

Complementary FIR-filters are described in more detail in "Handbook of Digital Signal Processing", published by D. F. Elliott, chapter 2, by P. P. Vaieyanathan, with the title "Design Implementation of Digital FIR Filters", Academic Press, 1987.

A zero-filled filter is a filter which has been expanded with a number of zero-value filter coefficients between each filter coefficient in the original filter. This is identical to obtaining the transfer function $H_{zero}(z)$ of the zero-filled filter by replacing z in the transfer function $H(z)$ of the original filter with $z^{n+1}$, where n is the number of zero-value filter coefficients between each filter coefficient in the original filter. In other words:

$$H_{zero}(z) = H(z^{n+1}).$$

For example:

$$H(z) = a_0 \; 0 \; a_1 * z^{-1},$$

$$n = 2$$

$$H_{zero}(z) = H(z^3) = a_0 + a_1 * z^{-3} = a_0 + 0 * z^{-1} + 0 * z^{-2} + a_1 * z^{-3}$$

Figure 3:
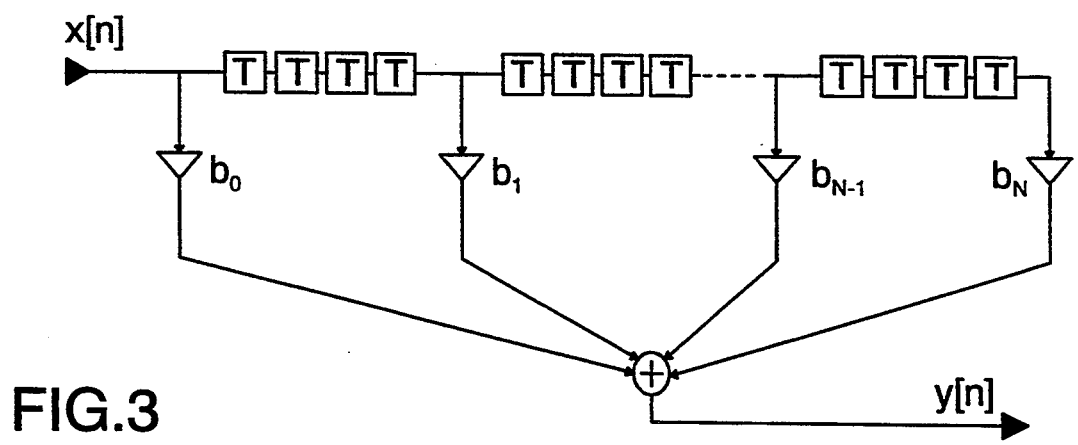
FIG. 3 illustrates a zero-filled FIR-filter, which has been constructed by replacing each time delay in the filter illustrated in FIG. 4 with four time delays.
Figure 4:
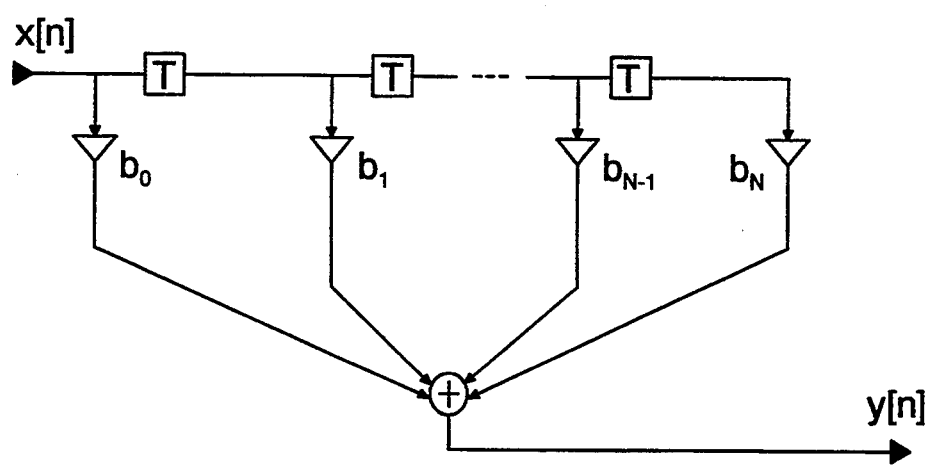
FIG. 4 illustrates a digital FIR-filter.

It is possible to begin with an LP-filter having a relatively short impulse response, and then expand the filter with a plurality of zero-value coefficients between each coefficient in the original filter. This is achieved by replacing each time shift in the original filter with a plurality of time shifts. The zero-filled filter shown in FIG. 3 has been obtained by expanding the filter shown in FIG. 4 with three zeros between each filter coefficient. This results in an increase in the degree number, without increasing the number of multiplications. This can be interpreted spectrally as though the frequency characteristic is compressed and repeated along the frequency axis. This occurs because the frequency characteristic of a digital filter is periodic with the sampling frequency $f_s$. The result is a filter having more stop bands with pass bands. These filters are steep in relation to the number of multiplications used.

The frequency characteristic of a zero-filled filter is characterized by:

$$|H_{zero}(z)| = |H(z^{1+n})|$$

where H is the original filter, $H_{zero}$ is the zero-filled filter and n is the number of zero-value filter coefficients between each coefficient in the original filter. This can also be expressed in the frequency plane $$(z = \mathit{e}^{j*2*pi*f*T})$$

$$|H_{zero}(f)| = |H((n+1)*f)|$$

Figure 5:
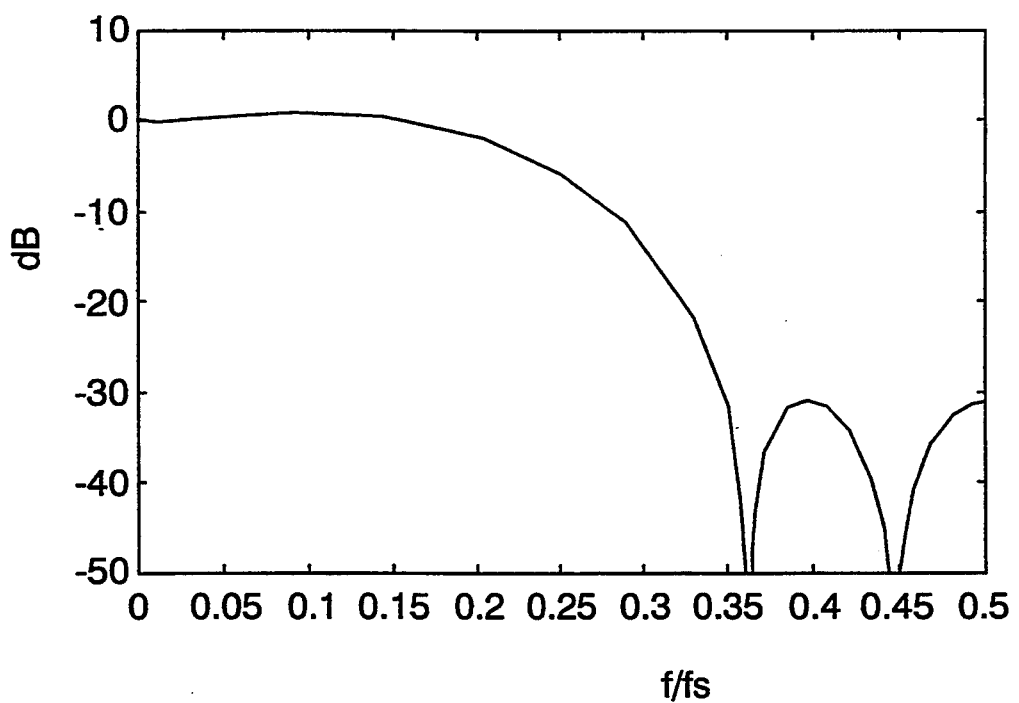
FIG. 5 illustrates the magnitude function of a linear-phase lowpass FIR-filter of degree 6, which can be realized with four multiplications per sample in accordance with FIG. 1.
Figure 6:
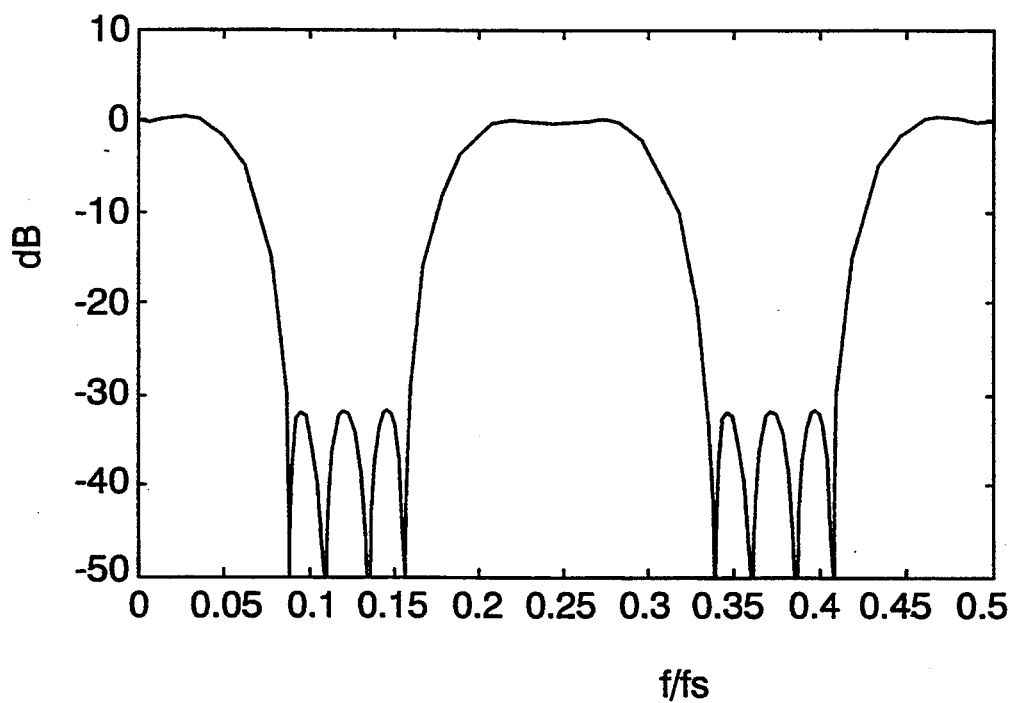
FIG. 6 illustrates the magnitude function of a zero-filled digital filter which has been constructed by replacing each time shift in the filter illustrated in FIG. 5 with four time shifts; this filter can also be realized with four multiplications per sample.

FIGS. 5 and 6 illustrate an example of a lowpass filter which has been expanded with three zeros between each coefficient.

Filters which are antisymmetric around half the sampling frequency also have in the impulse response a number of coefficients which are equal to zero.

Figure 7:
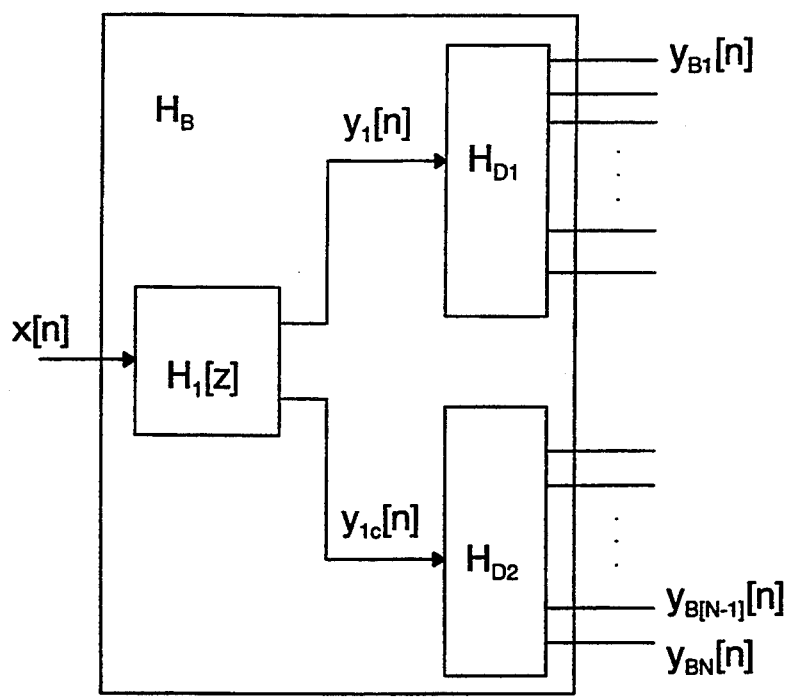
FIG. 7 illustrates a filter bank comprising a basic filter and downstream part-filter banks.
Figure 8:
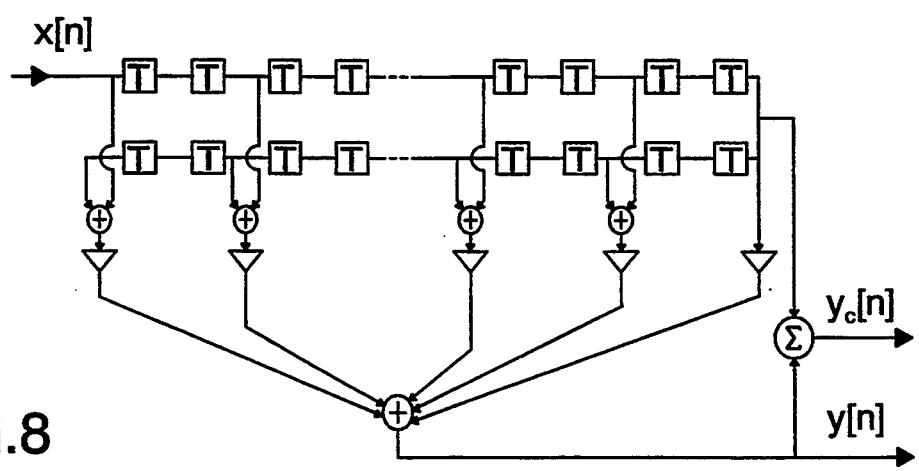
FIG. 8 illustrates a zero-filled linear-phase FIR-filter having a complementary output.

The inventive, novel filter bank construction will be seen from a structure according to FIG. 7. The construction is based on a basic filter $H_1(z)$ and downstream part-filter banks $H_{D1}$ and $H_{D2}$. The basic filter $H_1(z)$ is a zero-filled linear phase FIR-filter with a complementary output (FIG. 8). This filter is able to separate effectively mutually adjacent filter-bank bands with high degree numbers but with few multiplications.

Figure 9:
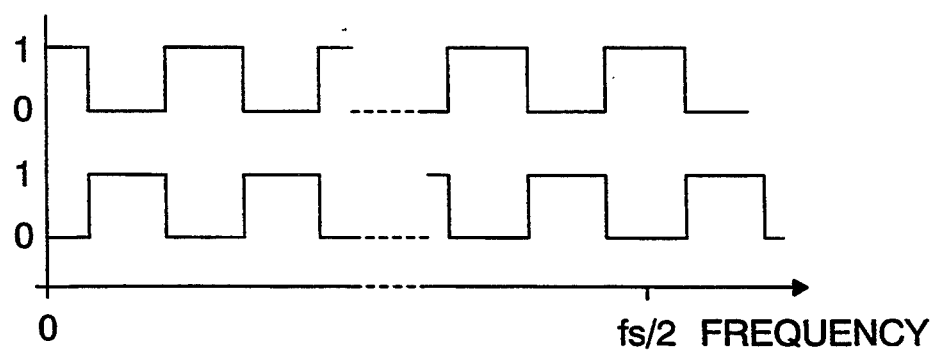
FIG. 9 illustrates the ideal magnitude function of the basic filter with complementary output.

FIG. 9 illustrates an idealized configuration of the frequency characteristic of the basic filter $H_1(z)$ and its complementary.

Figure 13A:
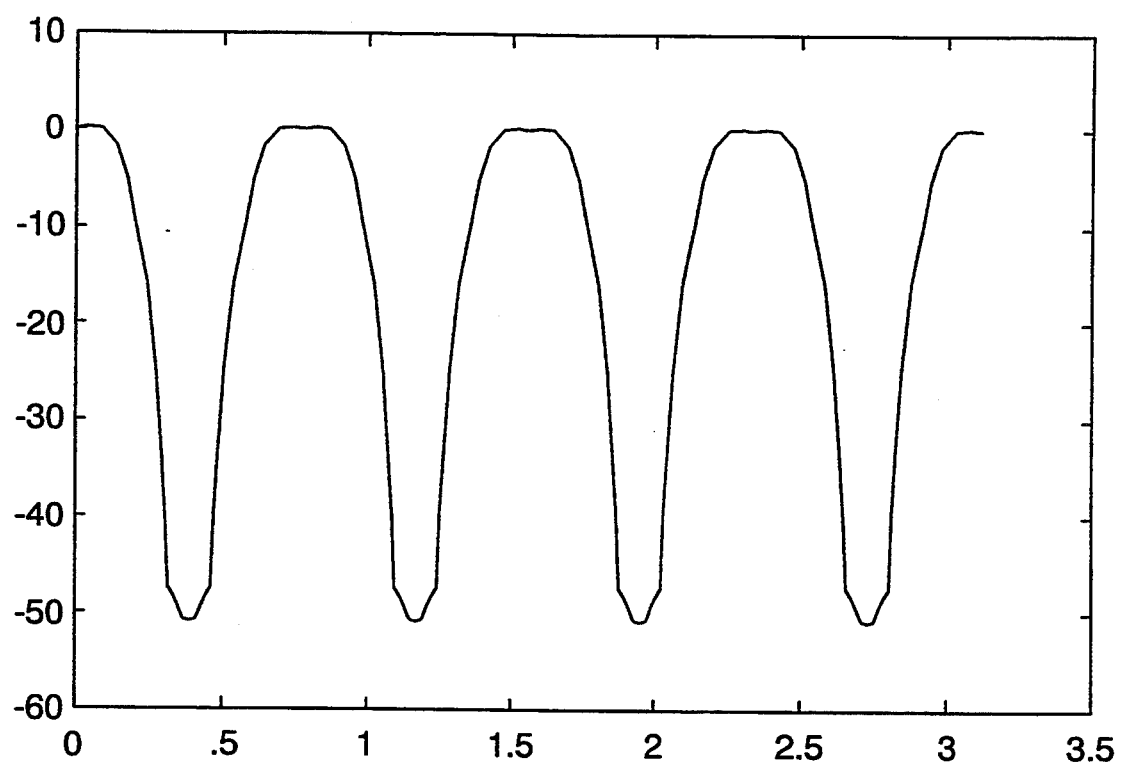
FIGS. 13a–13h illustrate the magnitude function of different filters $H_1(z)$, $H_2(z)$, $H_3(z)$, $H_4(z)$, $H_5(z)$, $H_6(z)$, $H_7(z)$ and $H_8(z)$ in one example having a filter bank with nine filter-bank bands.
Figure 13B:
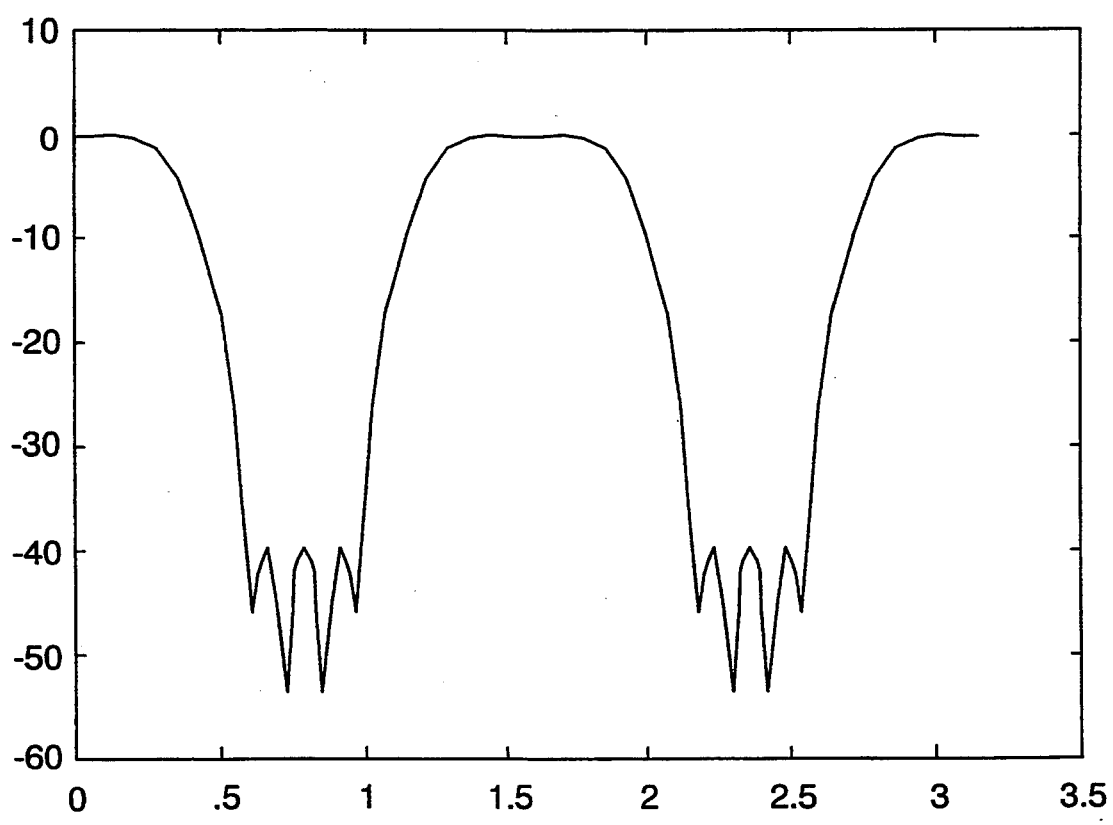
Figure 13C:
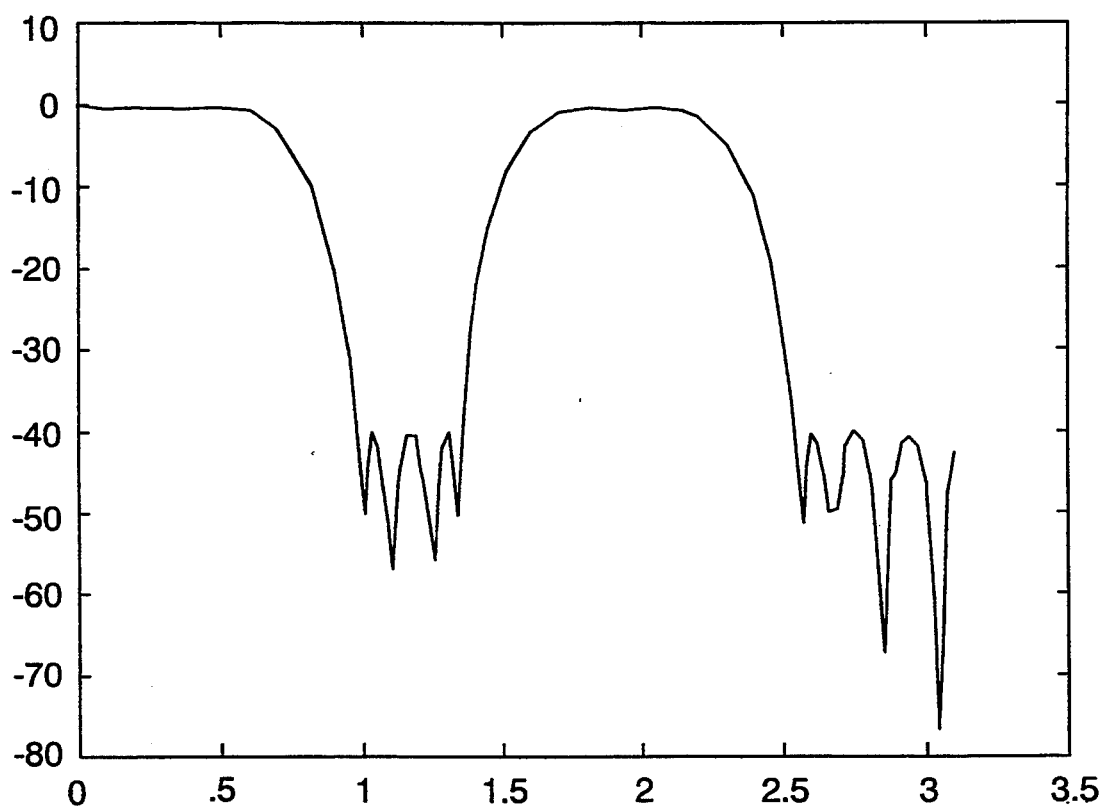
Figure 13D:
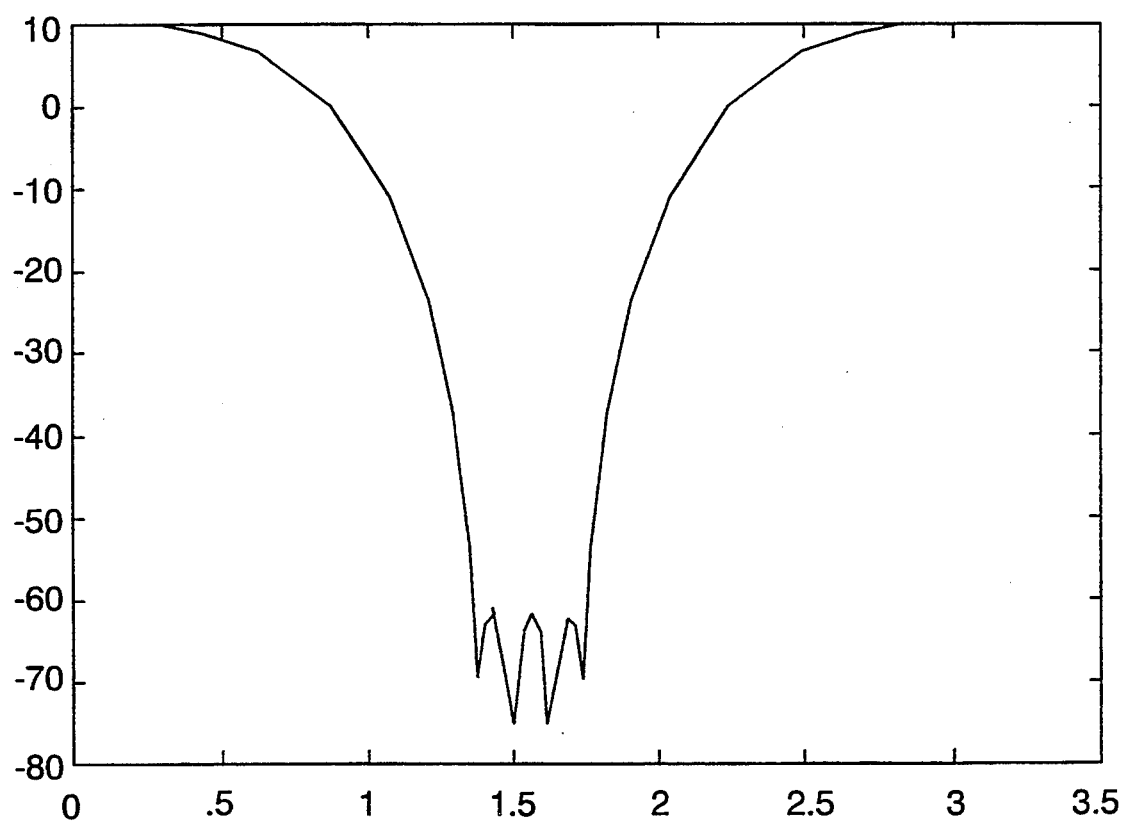
Figure 13E:
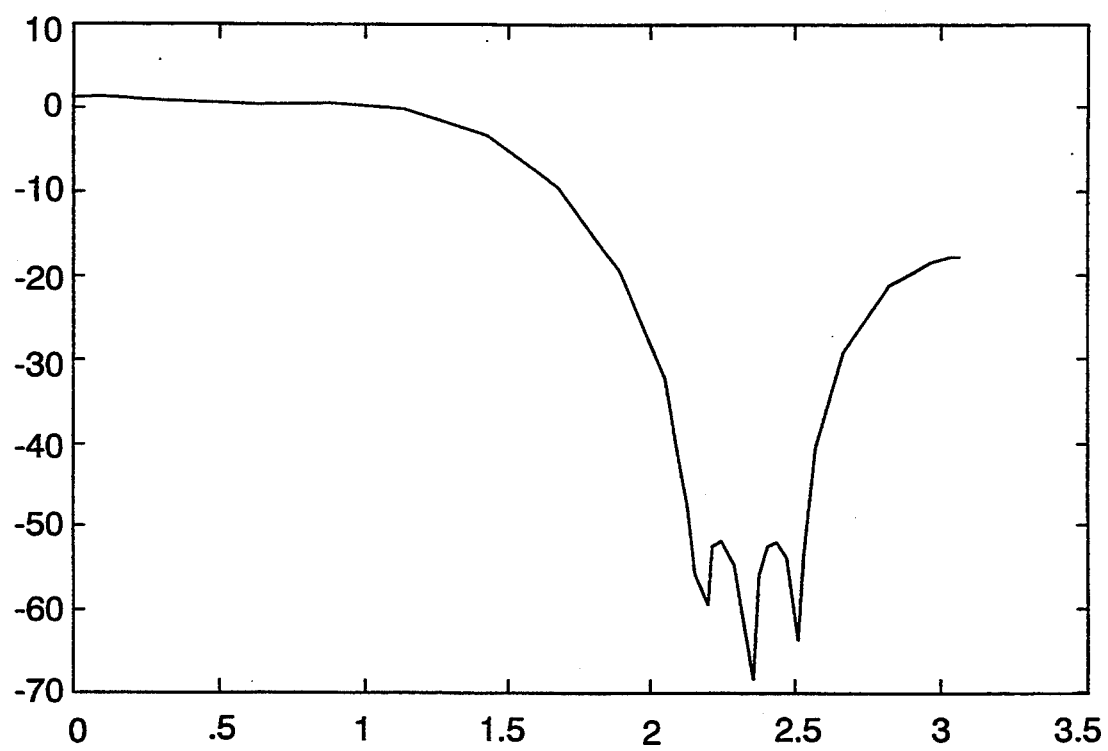
Figure 13F:
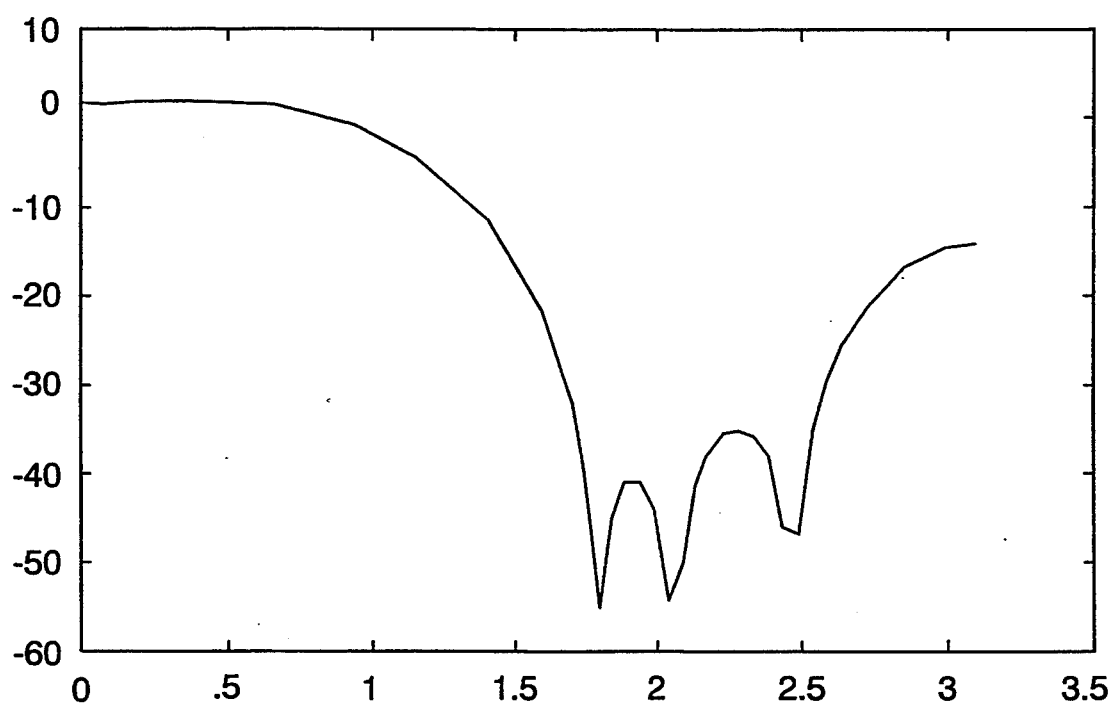
Figure 13G:
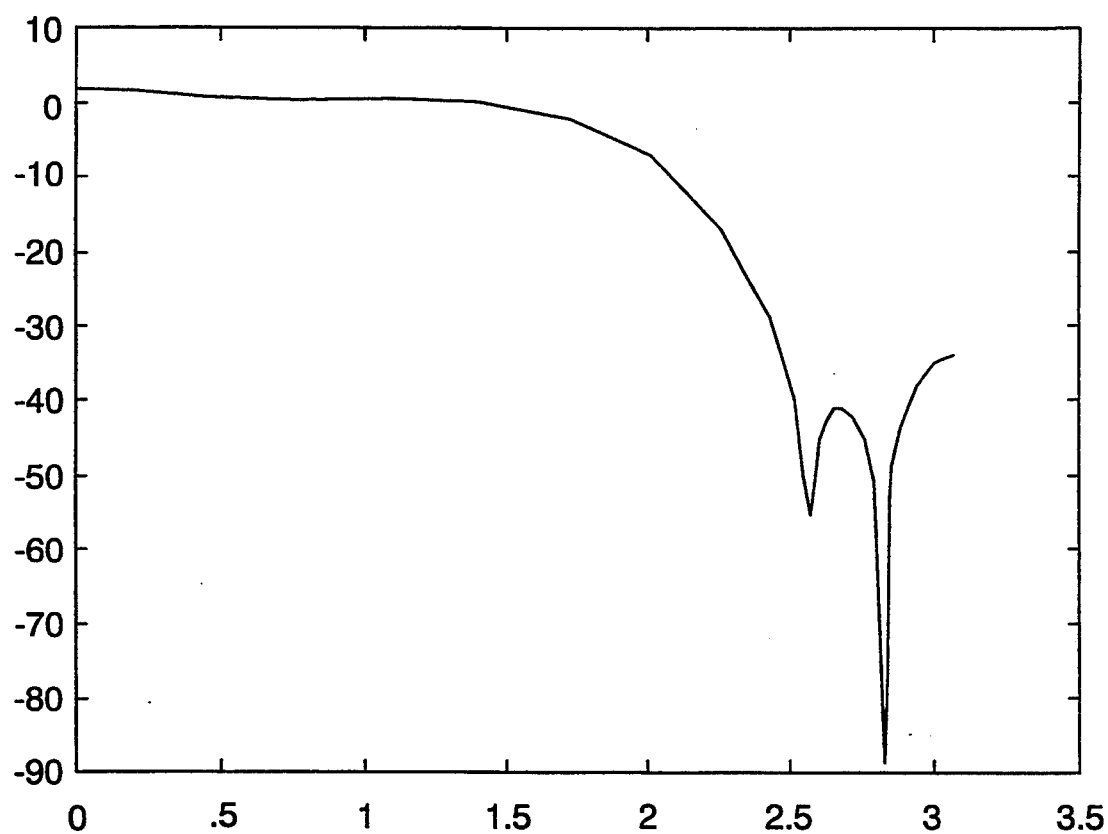
Figure 13H:
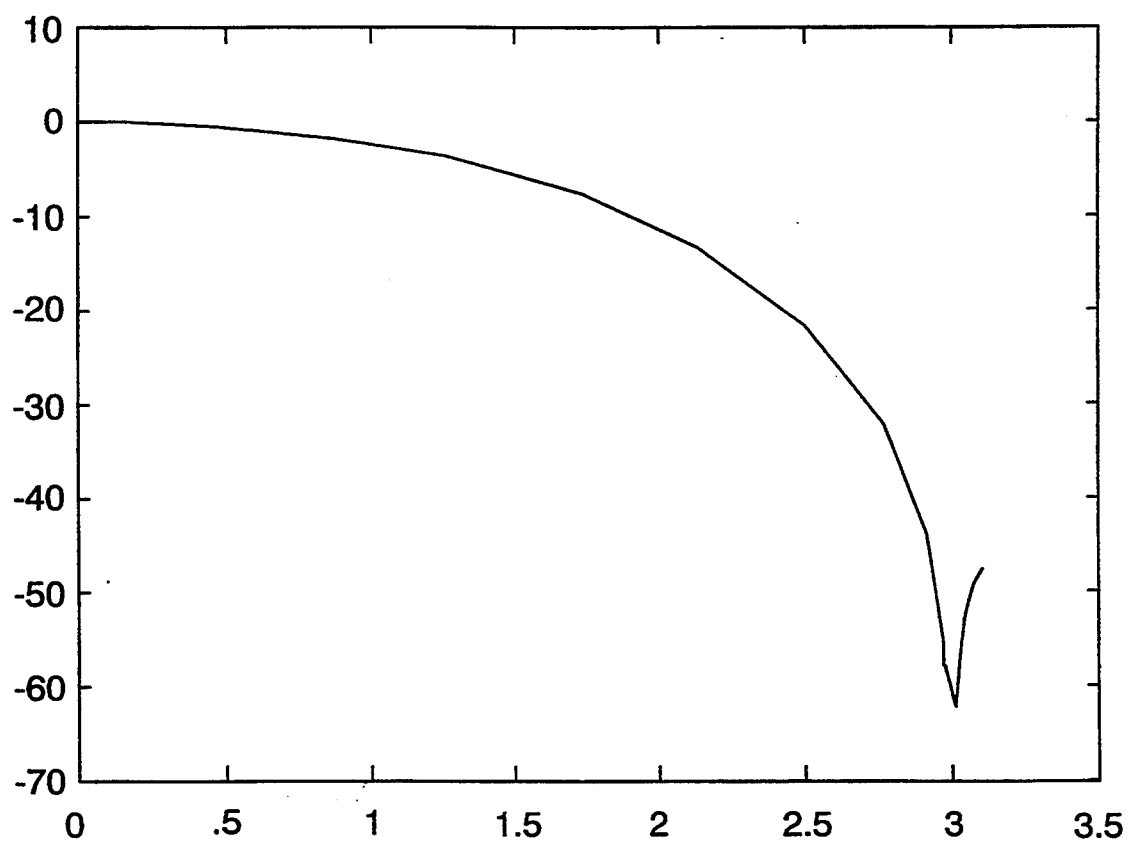

FIG. 13a illustrates an example of the frequency characteristic of a basic filter having three multiplications in a filter bank with nine outputs (nine filter-bank bands). The complementary output of the basic filter has pass bands when the basic filter has stop bands, and vice versa.

The basic filter and its complementary (FIG. 7) divides the input signal x(n) into two parts such as to separate all mutually adjacent filter-bank bands, so that each alternate filter-bank band is transferred to the output signal $y_1(n)$ and the remaining filter-bank bands are transferred to the complementary output $y_{1c}(n)$. By choosing a zero-filled filter as the basic filter, the majority of the filter coefficients will be equal to zero. It is therefore possible to use basic filters having very high degree numbers to achieve good separation between different filter-bank bands with the aid of a few multiplications.

The remainder of the structure, the part-filter banks, is used to separate the individual filter-bank bands, so that only one filter-bank band will be found in each output signal.

Figure 10:
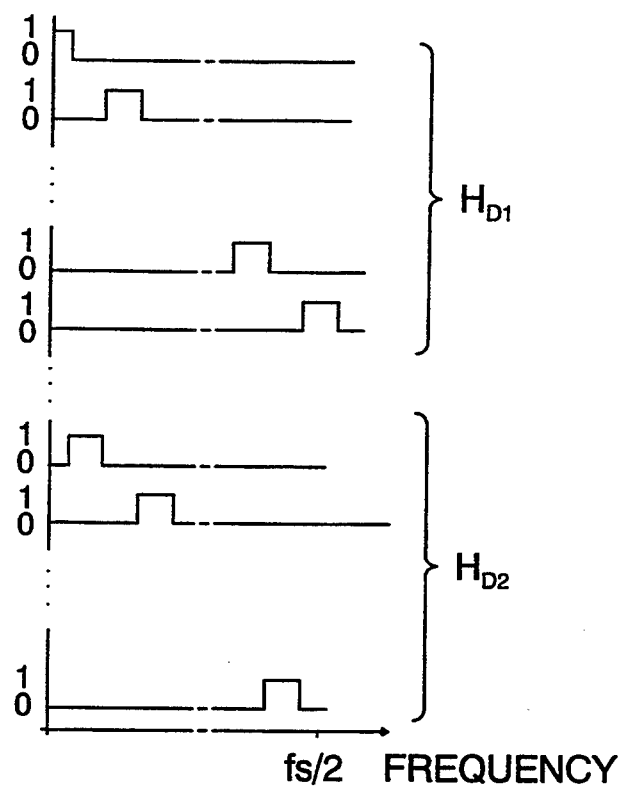
FIG. 10 is an idealized diagram relating to the frequency content of the outputs of two part-filter banks HD1 and HD2, said frequency content being the filter-bank bands.

FIG. 10 illustrates an idealized form of the frequency characteristic of the filter bank from the input on the basic filter $H_1(z)$ to the outputs of the part-filter banks $H_{D1}$ and $H_{D2}$. Thus, the number of filter-bank bands (output signals from the filter bank) is defined by the basic filter and its complementary.

Different embodiments of the part-filter banks are comprised of one or more introductory filters and optionally downstream part-filter banks, in accordance with FIG. 11.

The number of multiplications is reduced because:

The basic filter is zero-filled and therefore is able to filter-out each alternate frequency band with only a few multiplications;

The complementary of the basic filter is obtained with solely one subtraction; and The stop bands in the basic filter can be used as transition bands in the subsequent filters, thereby enabling the demands placed on the subsequent filters to be reduced.

It should be noted that the number of bands in the filter bank is defined by the basic filter and its complementary.

Figure 12:
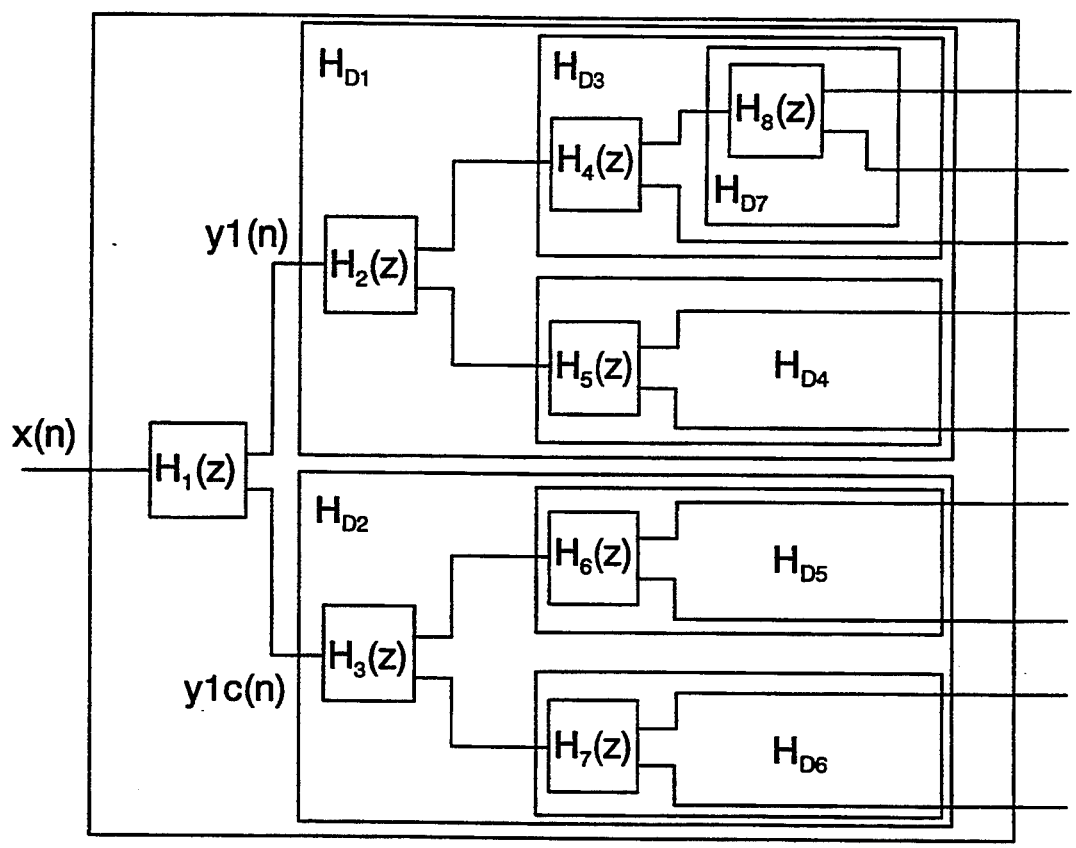
FIG. 12 illustrates an example of a filter bank having nine filter-bank bands.

FIGS. 12 and 13 illustrate an example where nine filter-bank bands are desired. The basic filter is constructed in accordance with FIG. 13a, as a linear phase complementary FIR-filter with five pass bands (four pass bands for the complementary). $H_{D1}$ ($H_{D2}$) is a part-filter bank according to FIG. 11a, and is comprised of an introductory linear phase complementary FIR-filter $H_2(z)$ ($H_3(z)$), according to FIG. 13b (FIG. 13c), and two subsequent part-filter banks, $H_{D3}$ and $H_{D4}$ ($H_{D5}$ and $H_{D6}$) (FIG. 12). $H_2(z)$ ($H_3(z)$) is constructed as a zero-filled linear phase complementary FIR-filter, so that said filter obtains pass bands for each alternate pass band from the basic filter (the complementary of the basic filter), but having a lower degree of zero-filling n than the basic filter (the complementary of the basic filter).

The arrangement, or array, can be repeated so that only one filter-bank band is found on each output from each part-filter bank. Accordingly, $H_{D3}$, $H_{D4}$, $H_{D5}$ and $H_{D6}$ will consist of an introductory linear phase complementary FIR-filter $H_4(z)$, $H_5(z)$, $H_6(z)$ and $H_7(z)$ respectively, and possibly of subsequent part-filter banks. The complementary of the filter $H_4(z)$ and $H_5(z)$, $H_6(z)$ and $H_7(z)$ and their complements contain only one filter-bank band and consequently have no subsequent part-filter banks. Only $H_{D7}$ is a subsequent part-filter bank, since the output signal from $H_4(z)$ contains more than one (two) filter-bank bands.

The configurations in this filter bank are as follows: $H_{D1}$ and $H_{D2}$ according to FIG. 11a, $H_{D3}$ according to FIG. 11e, and $H_{D4}$, $H_{D5}$, $H_{D6}$ and $H_{D7}$ according to FIG. 11c.

The filters whose magnitude functions are given in the FIGS. 13a–13h have the following zero-separated. filter coefficients:

Filter $H_1(z)$;
 $h(0) = h(48)$
 $H(16) = H(32)$
 $H(24)$

Remaining coefficients are equal to zero. This filter can thus be realized with three multiplications.

Filter $H_3(z)$;
 $h(0) = h(24)$
 $h(8) = h(16)$
 $h(12)$

Remaining coefficients are equal to zero. This filter can thus be realized with three multiplications.

Filter $H_4(z)$;
 $h(0) = h(30)$
 $h(2) = h(28)$
 $h(4) = h(26)$
 $h(6) = h(24)$
 $h(8) = h(22)$
 $h(10) = h(20)$
 $h(12) = h(18)$
 $h(14) = h(16)$
 $h(15) =$ Remaining coefficients are equal to zero. This filter is a 30-degree filter, but can be realized with nine multiplications.

Filter $H_5(z)$;
 $h(0) = h(12)$
 $h(4) = h(8)$
 $h(6)$

Remaining coefficients are equal to zero. This filter is a 12-degree filter, but can be realized with three multiplications.

Filter $H_6(z)$;
 $h(0) = h(10)$
 $h(2) = h(8)$
 $h(4) = h(6)$
 $h(5)$

Remaining coefficients are equal to zero. This filter is a 10-degree filter, but can be realized with four multiplications.

Filter $H_6(z)$;
 $h(0) = h(8)$
 $h(1) = h(7)$
 $h(2) = h(6)$
 $h(3) = h(5)$

This filter is an 8-degree filter, but can be realized with five multiplications.

Filter $H_7(z)$;
 $h(0) = h(8)$
 $h(1) = h(7)$
 $h(2) = h(6)$
 $h(3) = h(5)$
 $h(4)$ This filter is an 8-degree filter, but can be realized with five multiplications.

Filter $H_8(z)$;
 $h(0) = h(2)$
 $h(1)$

This filter is a 2-degree filter, but can be realized with two multiplications.

A summation of the number of multiplications (coefficients) separated from zero) in the aforesaid filters shows that the filter bank requires a total of 34 multiplications for each sample.

Figure 11A:
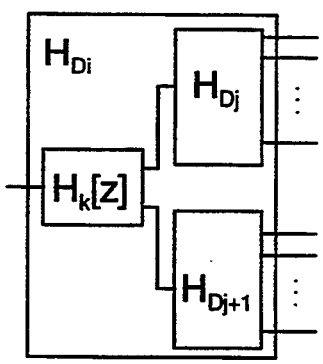
FIG. 11 illustrates embodiments of part-filter banks.
Figure 11B:
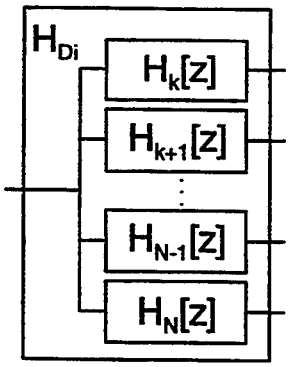
Figure 11C:
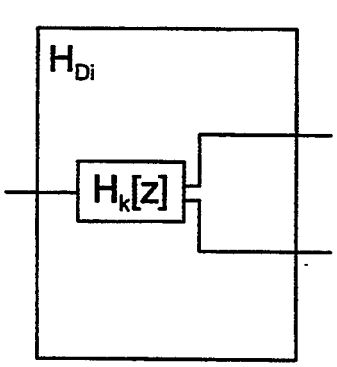
Figure 11D:
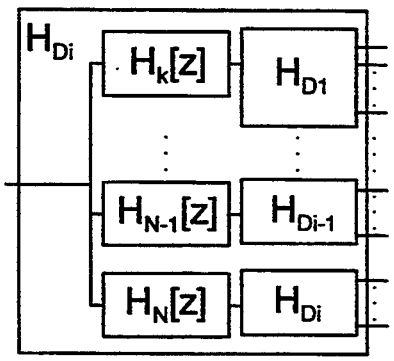
Figure 11E:
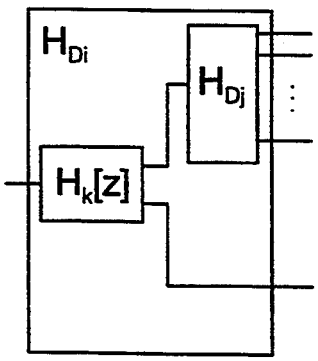
Figure 11F:
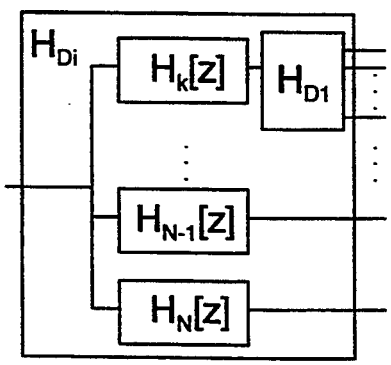

When $H_{D1}$ and $H_{D2}$ are constructed in accordance with the embodiment shown in FIG. 11b, a filter filters out each filter-bank band from the basic filter. The advantage with this embodiment, as compared with a filter bank constructed with parallel bandpass filters directly from the input signal, is that the demands on the filters downstream of the basic filter can be reduced. The transition band between pass band and stop band can be broadened, since each alternate filter-bank band can be filtered out. This enables the number of multiplications to be reduced.

We claim:

1. In a digital filter bank analyzer for use in battery operated applications, in which power consumption is reduced, as compared to a parallel realization of the filter bank analyzer, by reducing the number of multiplications carried out in the filter bank analyzer, the filter bank analyzer having filters, each filter having pass bands and stop bands, wherein one of the filters is an unexpanded digital basic filter having coefficients, a normal output and a complementary output, wherein the improvement comprises: the basic filter being expanded with a number of zero-value coefficients between each coefficient in the original basic filter; wherein a first part-filter bank is connected to the normal output, and a second part-filter bank is connected to the complementary output; wherein each pass band of the normal output of the expanded basic filter and each pass band of the complementary output of the expanded basic filter define the pass bands of the filter bank analyzer; wherein the first part-filter bank filters out those bands which are pass bands of the normal output of the expanded basic filter so that only one filter-bank band will be present on each output signal from the first part-filter bank; and wherein the second part-filter bank filters out those bands which are pass bands of the complimentary output of the expanded basic filter so that only one filter-bank band will be present on each output signal from the second part-filter bank.

2. The filter bank analyzer according to claim 1, wherein the input signal is divided into a set of frequency separate channels.

3. The filter bank analyzer according to claim 2, wherein each part-filter bank includes at least one introductory filter in parallel, each introductory filter having outputs.

4. The filter bank analyzer according to claim 3, wherein each introductory filter in the part-filter banks has pass bands and stop bands for each alternate pass band of the filter bank analyzer which has not been filtered out earlier.

5. The filter bank analyzer according to claim 3 further comprising additional filters connected to the outputs of each introductory filter.

6. The filter bank analyzer according to claim 2, wherein the expanded basic filter is a linear phase FIR-filter.

7. The filter bank analyzer according to claim 2, wherein the part-filter banks comprise zero-filled digital filters having outputs.

8. A filter bank analyzer, according to claim 7, wherein the zero-filled expanded digital basic filter

[H$_1$(z)] has outputs y$_1$(n) and y$_{1c}$(n) and seven zero-value coefficients between each coefficient in the original basic filter; the first part-filter bank [H$_{D1}$] being connected to output y$_1$(n) and comprising a zero-filled expanded introductory filter [H$_2$(z)] with outputs y$_2$(n) and y$_{2c}$(n); the introductory filter [H$_2$(z)] having three zero-value coefficients between each coefficient in the original basic filter; a zero-filled expanded filter [H$_4$(z)] with outputs y$_4$(n) and y$_{4c}$(n) being connected to output y$_2$(n); the filter [H$_4$(z)] having one zero-value coefficient between each coefficient in the original basic filter; a filter [H$_8$(z)] with outputs y$_8$(n) and y$_{8c}$(n) being connected to output y$_4$(n); and a filter [H$_5$(z)] with outputs y$_5$(n) and y$_{5c}$(n) being connected to output y$_{2c}$(n); and the second part-filter bank [H$_{D2}$] being connected to output y$_{1c}$(n) and comprising a zero-filled expanded introductory filter [H$_3$(z)] with outputs y$_3$(n) and y$_{3c}$(n); a filter [H$_6$(z)] with outputs y$_6$(n) and y$_{6c}$(n) being connected to output y$_3$(n); and a filter [H$_7$(z)] with outputs y$_7$(n) and y$_{7c}$(n) being connected to output y$_{3c}$(n).

9. The filter bank analyzer according to claim 2, wherein each part-filter bank has one introductory filter.

10. The filter bank analyzer according to claim 2, wherein the filters in the part-filter banks are linear phase FIR-filters.

* * * * *